(12) United States Patent
Yanagihashi et al.

(10) Patent No.: US 9,946,253 B1
(45) Date of Patent: Apr. 17, 2018

(54) ELECTRONIC APPARATUS AND METHOD

(71) Applicant: Kabushiki Kaisha Toshiba, Minato-ku, Tokyo (JP)

(72) Inventors: Hiroyuki Yanagihashi, Kanagawa (JP); Yasuhiro Kanishima, Tokyo (JP); Masahiro Ozawa, Tokyo (JP); Takashi Sudo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/638,233

(22) Filed: Jun. 29, 2017

(30) Foreign Application Priority Data

Feb. 2, 2017 (JP) ................................. 2017-017616

(51) Int. Cl.
  *G05B 23/02* (2006.01)
  *G06F 1/20* (2006.01)
(52) U.S. Cl.
  CPC ........... *G05B 23/0216* (2013.01); *G06F 1/20* (2013.01)
(58) Field of Classification Search
  None
  See application file for complete search history.

(56) References Cited

U.S. PATENT DOCUMENTS

| 9,294,829 | B2 | 3/2016 | Dannesboe et al. | |
| 2010/0252358 | A1* | 10/2010 | Rodrigues | G06F 1/20 181/206 |
| 2013/0037620 | A1* | 2/2013 | Aryanfar | G06F 1/20 236/49.3 |

FOREIGN PATENT DOCUMENTS

| EP | 0 883 104 A2 | 12/1998 |
| EP | 2 518 414 A1 | 10/2012 |
| JP | H05-187971 A | 7/1993 |
| JP | H10-339499 A | 12/1998 |
| JP | 2007-256153 A | 10/2007 |
| JP | 2011-137560 A | 7/2011 |
| JP | 4994431 B2 | 8/2012 |
| JP | 5089537 B2 | 12/2012 |
| JP | 2014-232084 A | 12/2014 |

* cited by examiner

*Primary Examiner* — Paul Huber
(74) *Attorney, Agent, or Firm* — Knobbe, Martens, Olson & Bear, LLP

(57) ABSTRACT

According to one embodiment, an electronic apparatus detects an abnormality of at least one of a first fan for a first device in a first housing and a second fan for a second device in a second housing, and includes a receiver and circuitry. The receiver receives a first signal of a first sound collected by a first microphone and a second signal of a second sound collected by a second microphone. The first sound includes a sound produced by a shaft or a bearing of the first fan. The second sound includes a sound produced by a shaft or a bearing of the second fan. The circuitry detects an abnormality of one of the first and second fans by at least using the first sound and the second sound included in the first and second signals.

12 Claims, 10 Drawing Sheets

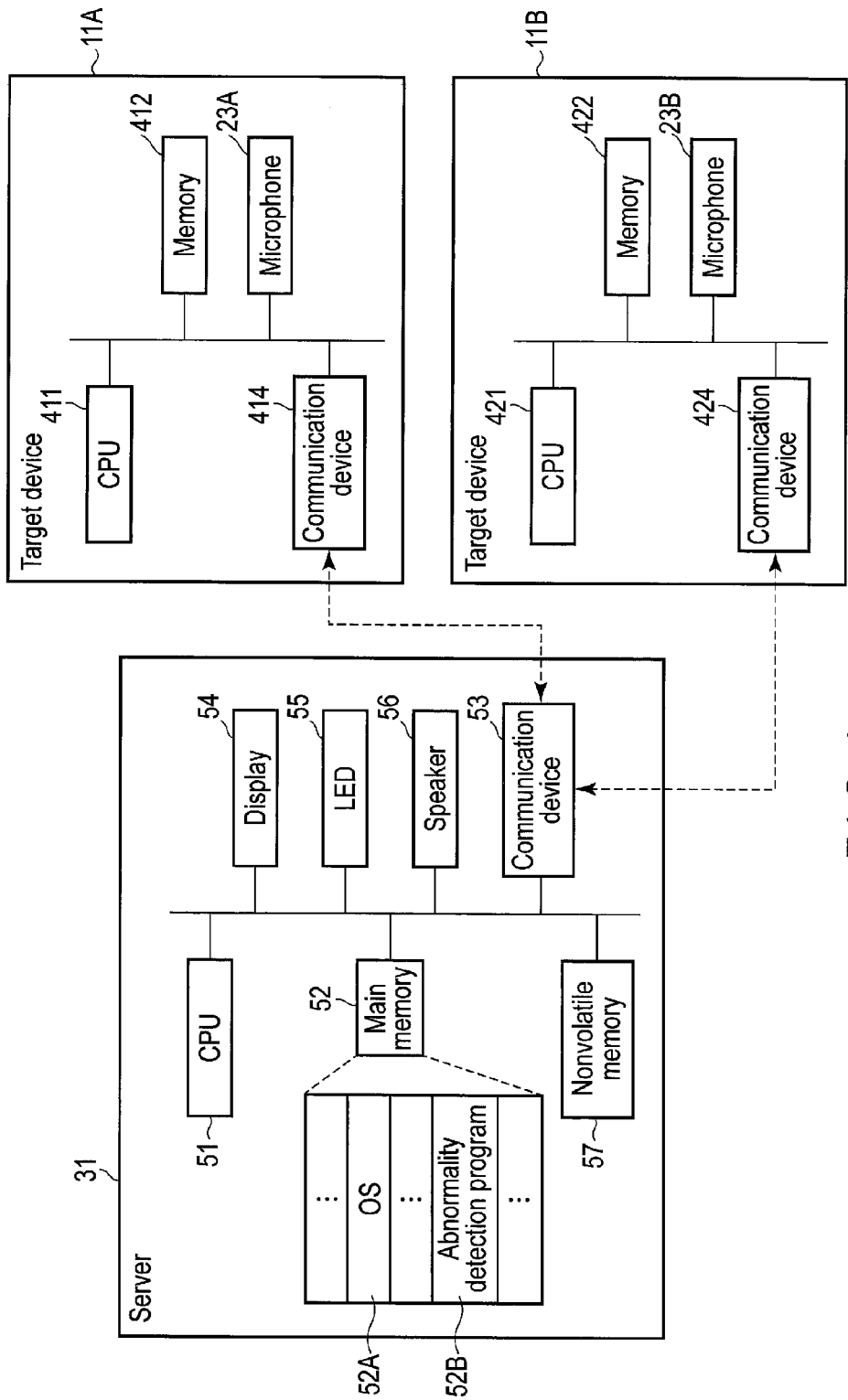
F I G. 4

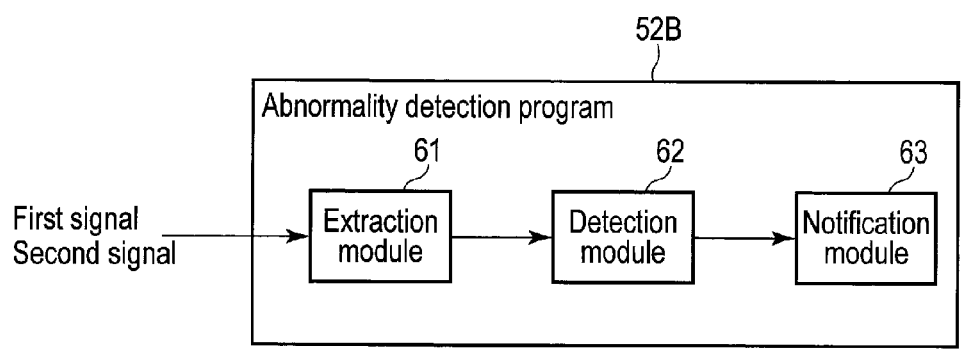
F I G. 5
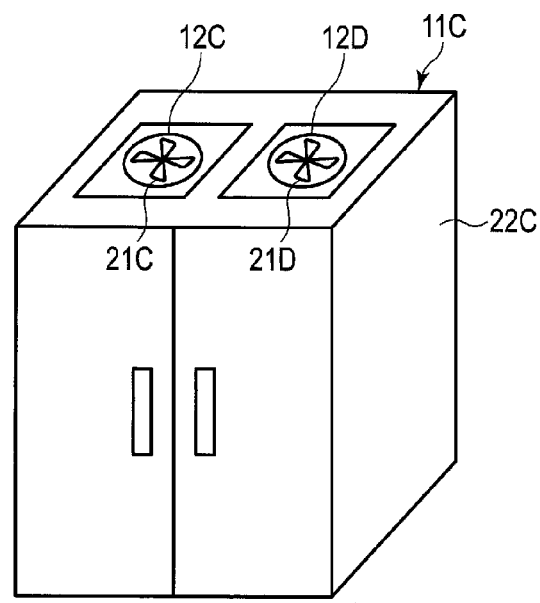
F I G. 7

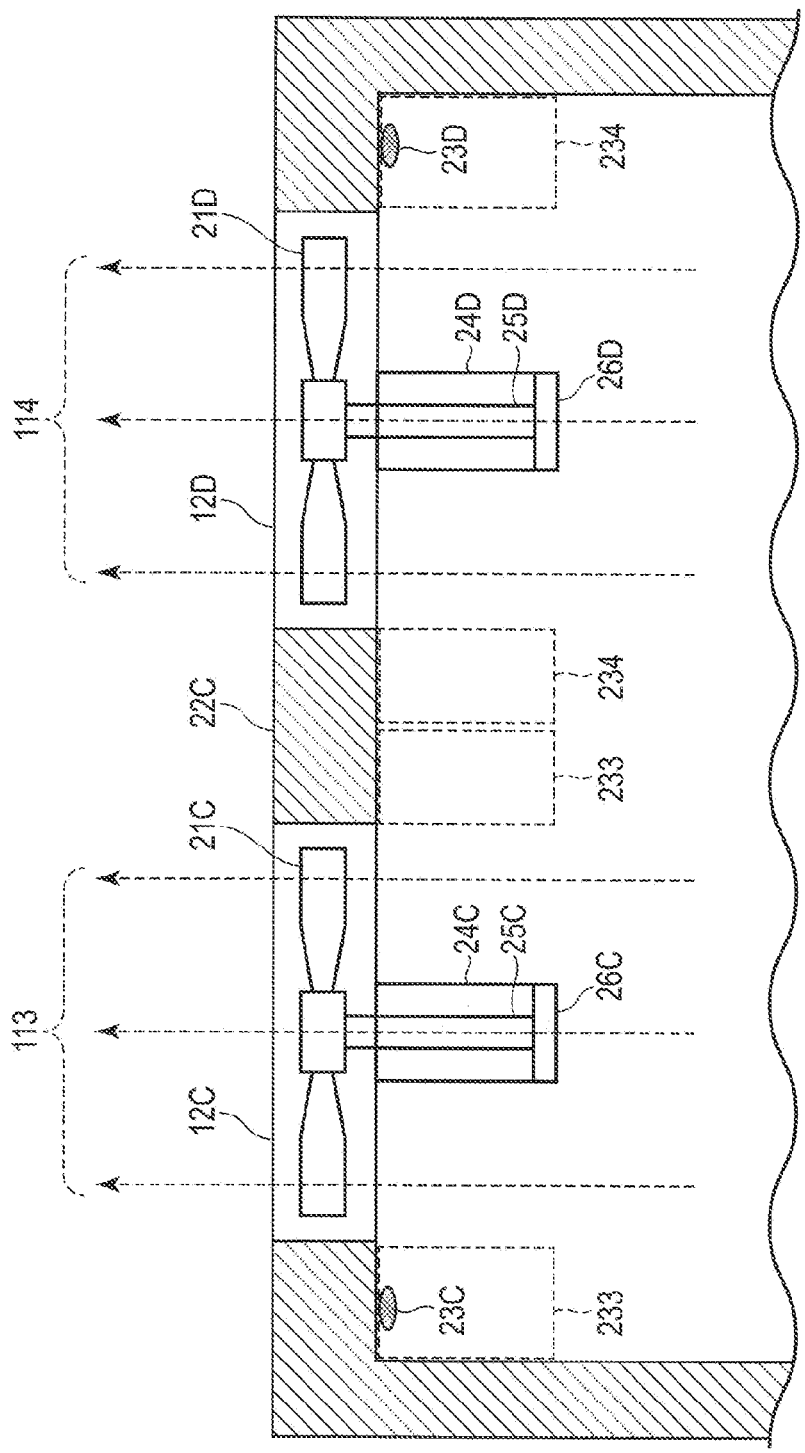
F I G. 8

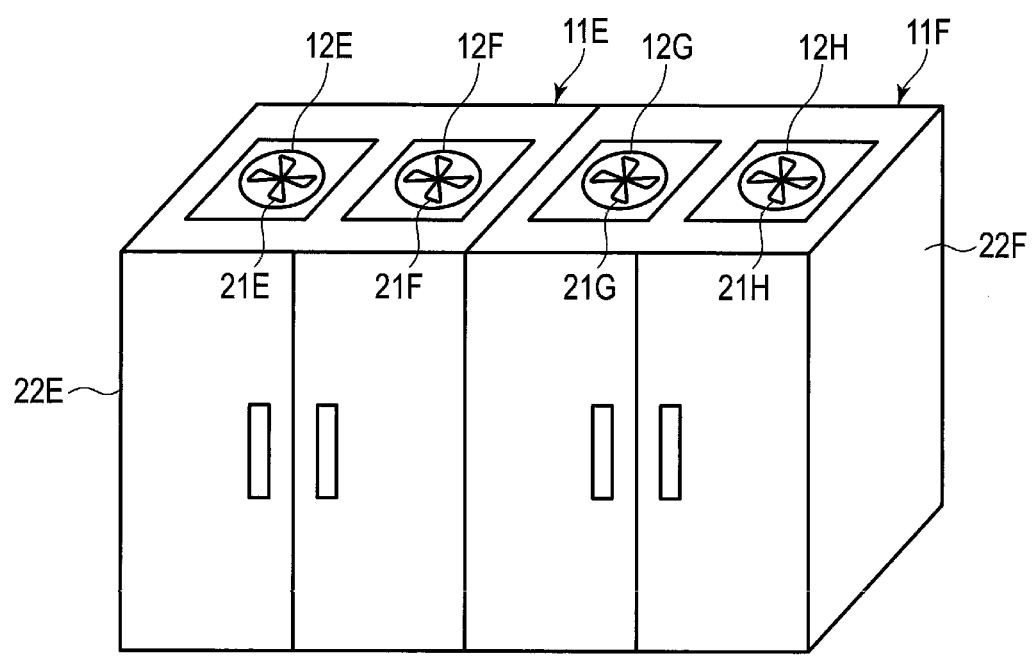
F I G. 11

ELECTRONIC APPARATUS AND METHOD

CROSS-REFERENCE TO RELATED APPLICATIONS

This application is based upon and claims the benefit of priority from Japanese Patent Application No. 2017-017616, filed Feb. 2, 2017, the entire contents of which are incorporated herein by reference.

FIELD

Embodiments described herein relate generally to an electronic apparatus which detects abnormality by operating noise, and a method applied to the device.

BACKGROUND

Industrial devices are periodically examined to maintain safety. Technologies for monitoring the state of devices by acceleration sensors or temperature sensors have been put into practical use to promptly detect abnormality in operation and prevent an accident. In many cases, mechanical abnormality is noticed by noise. Thus, as a method of monitoring the state of devices based on operating noise, technologies for analyzing acoustic data and detecting a mechanical failure have been developed.

When the device to be monitored includes a component which produces an airflow, such as a fan, a microphone may be exposed to the airflow. Thus, the signal of air noise may be mixed in the signal of sound collected by the microphone. Therefore, a new technology for accurately detecting the abnormality of the device by reducing the influence of air noise is required.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 4 is a block diagram showing an example of the system configuration of the target devices and the electronic apparatus of the embodiment.

FIG. 5 is a block diagram showing an example of the functional configuration of an abnormality detection program executed by the electronic apparatus of the embodiment.

FIG. 7 is a perspective view showing another example of the external appearance of the device to be monitored by the electronic apparatus of the embodiment.

FIG. 8 is a cross-sectional view showing an example of the structure of a housing provided in the target device of FIG. 7.

FIG. 11 is a perspective view showing yet another example of the external appearance of the devices to be monitored by the electronic apparatus of the embodiment.

DETAILED DESCRIPTION

Various embodiments will be described hereinafter with reference to the accompanying drawings.

In general, according to one embodiment, an electronic apparatus detects an abnormality of at least one of a first fan for a first device in a first housing and a second fan for a second device in a second housing. The electronic apparatus includes a receiver and circuitry. The receiver is configured to receive a first signal of a first sound collected by a first microphone and a second signal of a second sound collected by a second microphone. The first sound includes a sound produced by a shaft or a bearing of the first fan. The second sound includes a sound produced by a shaft or a bearing of the second fan. The first microphone is away a first distance from the first fan in a direction perpendicular to a first direction of an airflow produced by the first fan and provided on a side of the first housing corresponding to an opposite direction of the first direction. The second microphone is away a second distance from the second fan in a direction perpendicular to a second direction of an airflow produced by the second fan and provided on a side of the second housing corresponding to an opposite direction of the second direction. The circuitry is configured to detect an abnormality of one of the first and second fans by at least using the first sound and the second sound included in the first and second signals. The circuitry is configured to indicate that the abnormality is detected in the first fan, if an abnormality is detected in the first fan. The circuitry is configured to indicate that the abnormality is detected in the second fan, if an abnormality is detected in the second fan.

Figure 1:
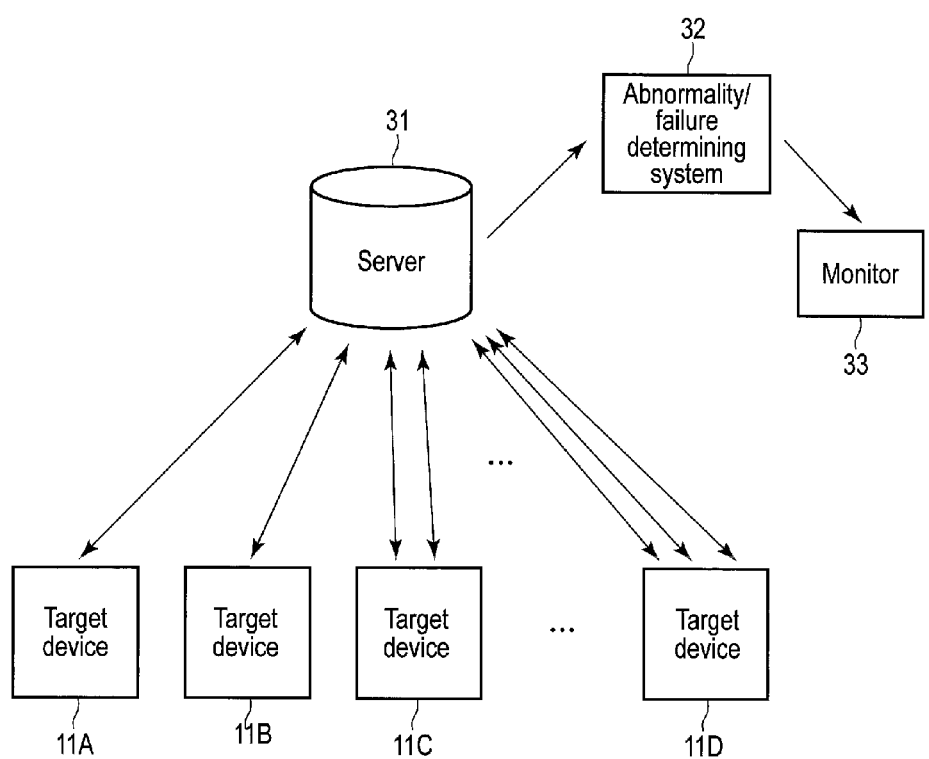
FIG. 1 is shown for explaining an example of the configuration of a monitoring system including an electronic apparatus according to one embodiment.

This specification explains the configuration of a monitoring system including an electronic apparatus according to one embodiment with reference to FIG. 1. The electronic apparatus may be realized as, for example, a server computer or a system incorporated into various electronic apparatuses. In the following explanation, the electronic apparatus is assumed to be a server 31. The server 31 monitors at least one of target devices 11A, 11B, 11C and 11D, and detects the abnormality or failure of each of the target devices 11A, 11B, 11C and 11D in cooperation with an abnormality/failure determining system 32. The server 31 is configured to either monitor a single target device or monitor multiple target devices in parallel. The abnormality/failure determining system 32 may be provided in the server 31, or may be provided in a computer different from the server 31.

The target devices 11A, 11B, 11C and 11D are, for example, uninterruptible power systems (UPS), server computers or various industrial devices. Each of the target devices 11A, 11B, 11C and 11D includes a microphone configured to obtain the signal of operating noise, and a structure configured to generate an airflow inside a housing, such as a fan. The microphone is provided at a position unaffected by the airflow produced by the fan, etc., inside the housing. In this way, it is possible to prevent inclusion of noise produced by application of air of the fan to the microphone in the signal of operation.

The server 31 is configured to exchange data with the target devices 11A, 11B, 11C and 11D, using wired or wireless communication. The target devices 11A, 11B, 11C and 11D transmit the signal of sound collected by the microphones provided in the respective housings to the server 31. The server 31 accumulates the signals of sound received from the target devices 11A, 11B, 11C and 11D in a storage device, etc. The server 31 and the abnormality/failure determining system 32 perform the abnormality detection, failure detection, failure diagnosis (for example, identification of the type of failure), failure prediction, and residual life prediction of the target devices 11A, 11B, 11C and 11D by analyzing the accumulated signals of sound.

The administrator (user) is notified of the state of the target devices 11A, 11B, 11C and 11D, such as a detected abnormality or failure, via a monitor 33, etc. The monitor 33 may be directly connected to the server 31, or may be connected via a network as the monitor of a terminal used by the administrator. For example, a message to indicate an abnormality or failure is displayed on the monitor 33. This indication is not limited to display on the monitor 33, and may be realized by generating an alarm from a speaker, lighting or blinking an LED, etc.

Figure 2:
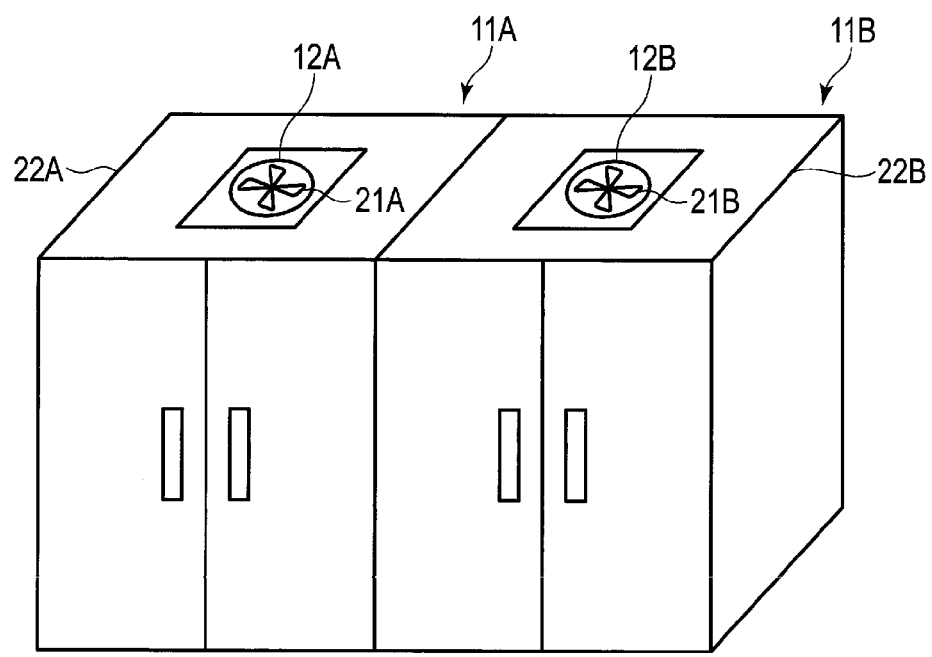
FIG. 2 is a perspective view showing an example of the external appearance of the devices to be monitored by the electronic apparatus of the embodiment.

FIG. 2 shows an example of the external appearance of the target devices 11A and 11B. As shown in FIG. 2, the target devices 11A and 11B include, for example, housings 22A and 22B having the same shape, and are adjacent to each other such that the right side of the housing 22A of the target device 11A is in contact with the left side of the housing 22B of the target device 113. In the example, the target devices 11A and 11B are UPSs including fans 21A and 21B. In the target devices 11A and 113, the air in the housings is discharged to the outside of the housings through outlets 12A and 12B as opening portions, using the fans 21A and 21B. In this way, heat exhaust is performed.

More specifically, the target device 11A has the housing 22A such that the outlet 12A is provided on the upper surface of the housing 22A. The fan 21A configured to discharge the air in the housing 22A to the outside of the housing 22A is provided in the outlet 12A.

Figure 3:
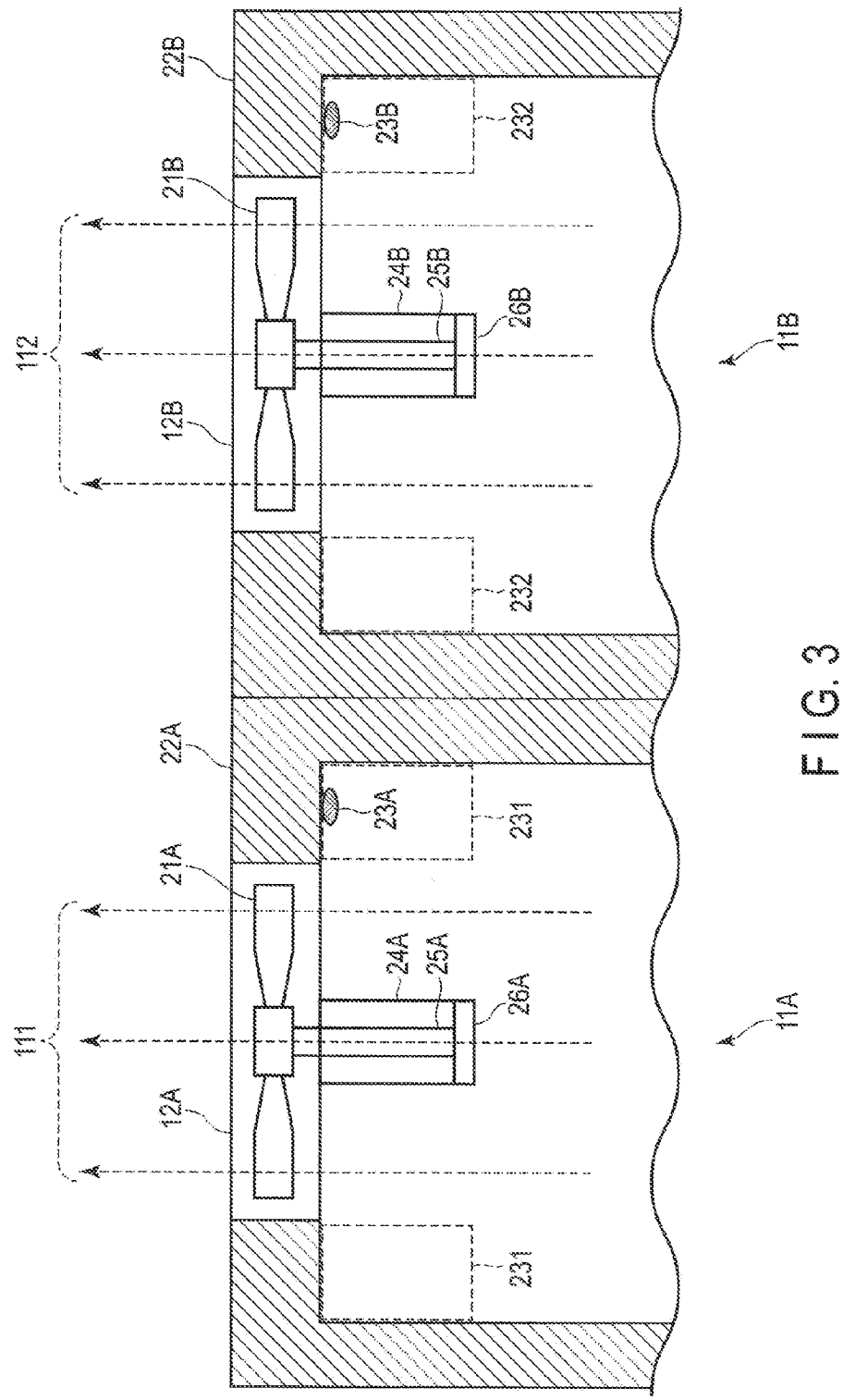
FIG. 3 is a cross-sectional view showing an example of the structure of a housing provided in each target device of FIG. 2.

As shown in the cross-sectional view of FIG. 3, the fan 21A is provided in the outlet 12A provided on the upper surface of the housing 22A. The fan 21A is connected to a motor 24A, a shaft 25A and a bearing 26A for rotation. The shaft 25A located in the center of the fan 21A is a component configured to transfer power by motor 24A, rotate with the fan 21A and serve as the center of rotation. The bearing 26A is a component which is in contact with the rotating fan 21A (shaft 25A), receives load and supports the shaft 25A, etc.

FIG. 3 shows arrows 111 schematically indicating the direction of airflow produced by rotation of the fan 21A. A microphone 23A (first microphone) is provided near the fan 21A at a position off the airflow on a side opposite to the direction of airflow (in other words, the direction of discharge) 111 with respect to the housing 22A to which the fan 21A is secured. If it is difficult to provide the microphone 23A at a position completely off the direction of airflow 111, the microphone 23A may be provided at a position which reduces the influence of the airflow as much as possible.

As shown in FIG. 3, if the direction of airflow 111 produced by operation of the fan 21A is a first direction, for example, the microphone 23A is provided at a first position a first distance away from the fan 21A in a direction perpendicular to the first direction inside the housing 22A on a side opposite to the first direction with respect to a first surface on which the fan 21A is provided (for example, the upper surface of the housing 22A including the outlet 12A).

Thus, the microphone 23A is provided at the first position the first distance away from the fan 21A in a direction perpendicular to the first direction inside the housing 22A on the windward side with respect to the first surface on which the fan 21A is provided. The microphone 23A may be provided at a position off the airflow produced by the fan 21A in a horizontal direction from the shaft 25A or the bearing 26A of the fan 21A. In the example of FIG. 3, the microphone 23A is provided on the rear surface of the top board of the housing 22A. However, the microphone 23A may be provided at an arbitrary position satisfying the above conditions, for example, at an arbitrary position inside an area 231. Alternatively, the microphone 23A may be provided at a position the first distance away from the fan 21A in a direction perpendicular to the first direction outside the housing 22A on the downwind side with respect to the first surface on which the fan 21A is provided.

The above structure reduces air noise produced by application of air of the operating fan 21A to the microphone 23A. In this way, it is possible to reduce disturbance to a signal obtained by the microphone 23A, in other words, inclusion of noise in the signal.

In a similar manner, the target device 11B has housing 22B such that the outlet 12B is provided on the upper surface of the housing 22B. The fan 21B configured to discharge the air in the housing 22B to the outside of the housing 22B is provided in the outlet 12B.

As shown in the cross-sectional view of FIG. 3, the fan 21B is provided in the outlet 12B provided on the upper surface of the housing 22B. The fan 21B is connected to a motor 24B, a shaft 25B and a bearing 26B for rotation. The shaft 25B located in the center of the fan 21B is a component configured to transfer power by the motor 24B, rotate with the fan 21B and serve as the center of rotation. The bearing 26B is a component which is in contact with the rotating fan 21B (shaft 25B), receives load and supports the shaft 25B, etc.

FIG. 3 shows arrows 112 schematically indicating the direction of airflow produced by rotation of the fan 21B. A microphone 23B (second microphone) is provided near the fan 21B at a position off the airflow on a side opposite to the direction of airflow 112 with respect to the housing 22B to which the fan 21B is secured. When it is difficult to provide the microphone 23B at a position completely off the direction of airflow 112, the microphone 23B may be provided at a position which reduces the influence of the airflow as much as possible.

As shown in FIG. 3, if the direction of airflow 112 produced by operation of the fan 21B is a second direction, for example, the microphone 23B is provided at a second position a second distance away from the fan 21B in a direction perpendicular to the second direction inside the housing 22B on a side opposite to the second direction with respect to a second surface on which the fan 21B is provided (for example, the upper surface of the housing 22B including the outlet 12B). Thus, the microphone 23B is provided at the second position the second distance away from the fan 21B in a direction perpendicular to the second direction inside the housing 22B on the windward side with respect to the second surface on which the fan 21B is provided. The microphone 23B may be provided at a position off the airflow produced by the fan 21B in a horizontal direction from the shaft 25B or the bearing 26B of the fan 21B. In the example of FIG. 3, the microphone 23B is provided on the rear surface of the top board of the housing 22B. However, the microphone 23B may be provided at an arbitrary position satisfying the above conditions, for example, at an arbitrary position inside an area 232. Alternatively, the microphone 23B may be provided at a position the second distance away from the fan 21B in a direction perpendicular to the second direction outside the housing 22B on the downwind side with respect to the second surface on which the fan 21B is provided.

The above structure reduces air noise produced by application of air of the operating fan 21B to the microphone 23B. In this way, it is possible to reduce disturbance to a signal obtained by the microphone 23B, in other words, inclusion of noise in the signal.

As explained above, the microphones 23A and 23B are provided so as to reduce the influence of the airflow. In this manner, the signal-to-noise ratio of signals collected by the microphones 23A and 23B is improved. It is possible to improve the accuracy of analysis of abnormality or failure using the signals. Moreover, the above arrangement can reduce the cost of the microphones 23A and 23B to be used (degrade the performance of the microphones 23A and 23B to be used). Thus, it is possible to easily detect the abnormality or failure of each of the target devices at low cost.

FIG. 4 shows the system configuration of the server 31 and the two target devices 11A and 11B. In the following explanation, it is assumed that the server 31 has the function of the above abnormality/failure determining system 32. The server 31 monitors the target devices 11A and 11B in parallel. For example, the server 31 detects the abnormality of the fan 21A provided in the housing 22A of the target device 11A and the abnormality of the fan 21B provided in the housing 22B of the target device 11B.

The target device 11A includes, for example, a CPU 411, a memory 412, the microphone 23A and a communication device 414.

The CPU 411 is a processor configured to control the operations of various components in the target device 11A. The communication device 414 is a device configured to perform wired or wireless communication. The communication device 414 includes a transmitter configured to transmit a signal, and a receiver configured to receive a signal.

The CPU 411 obtains (generates) a signal of sound collected by the microphone 23A. The CPU 411 transmits an identifier (ID) given to the microphone 23A in advance and the obtained signal of sound to the server 31, using the communication device 414. For example, the signal of sound is transmitted to the server 31 at regular time intervals. The obtained signal of sound may be stored in the memory 412, etc.

In a similar manner, the target device 11B includes, for example, a CPU 421, a memory 422, the microphone 23B and a communication device 424.

The CPU 421 is a processor configured to control the operations of various components in the target device 11B. The communication device 424 is a device configured to perform wired or wireless communication. The communication device 424 includes a transmitter configured to transmit a signal, and a receiver configured to receive a signal.

The CPU 421 obtains (generates) a signal of sound collected by the microphone 23B. The CPU 421 transmits an identifier (ID) given to the microphone 23B in advance and the obtained signal of sound to the server 31, using the communication device 424. For example, the signal of sound is transmitted to the server 31 at regular time intervals. The obtained signal of sound may be stored in the memory 422, etc.

The server 31 includes, for example, a CPU 51, a main memory 52, a communication device 53, a display 54, an LED 55, a speaker 56, and a nonvolatile memory 57.

The CPU 51 is a processor configured to control the operations of various components in the server 31. The CPU 51 executes various programs loaded into the main memory 52 from the nonvolatile memory 57 which is a storage device. These programs include an operating system (OS) 52A and various application programs. The application programs include an abnormality detection program 52B. For example, the abnormality detection program 52B has a function for analyzing an audio signal received from the target devices 11A and 11B, detecting the abnormality of each of the target devices 11A and 11B and indicating the detected abnormality. The CPU 51 realizes this function by executing instructions included in the abnormality detection program 52B.

The communication device 53 is a device configured to perform wired or wireless communication. The communication device 53 includes a transmitter configured to transmit a signal, and a receiver configured to receive a signal. The receiver of the communication device 53 receives, for example, a first signal of sound collected by the microphone 23A of the target device 11A, and a second signal of sound collected by the microphone 23B of the target device 11B.

The display 54 displays a screen image based on a display signal generated by the CPU 51. The LED 55 is turned on based on a signal generated by the CPU 51. The speaker 56 outputs sound based on an audio signal generated by the CPU 51. The server 31 is capable of indicating the abnormality of each of the target devices 11A and 11B, using at least one of the display 54, the LED 55 and the speaker 56. The indication of the abnormality of each of the target devices 11A and 11B is not limited to the indication by the display 54, the LED 55 and/or the speaker 56. Any structure may be employed as long as the administrator can recognize the abnormality of each of the target devices 11A and 11B (for example, the abnormality of each of the fans 21A and 21B).

FIG. 5 shows the functional configuration of the abnormality detection program 52B executed by the server 31. The first signal of sound collected by the microphone 23A of the target device 11A and the second signal of sound collected by the microphone 23B of the target device 11B are received by the communication device 53. The received first and second signals are input to the abnormality detection program 52B. The abnormality detection program 52B includes, for example, an extraction module 61, a detection module 62 and a notification module 63.

The extraction module 61 extracts a first sound produced by the shaft 25A or the bearing 26A of the fan 21A (a first fan) of the target device 11A and a second sound produced by the shaft 25B or the bearing 26B of the fan 21B (a second fan) of the target device 11B, using the first signal and the second signal. The housing 22A of the target device 11A is adjacent to the housing 22B of the target device 11B. Thus, the first signal may include the second sound produced by the shaft 25B or the bearing 26B of the fan 21B of the target device 11B in addition to the first sound produced by the shaft 25A or the bearing 26A of the fan 21A of the target device 11A. The first signal may further include another noise. Similarly, the second signal may include the first sound produced by the shaft 25A or the bearing 26A of the fan 21A of the target device 11A in addition to the second sound produced by the shaft 25B or the bearing 26B of the fan 21B of the target device 11B. The second signal may further include another noise.

When extracting the first sound and the second sound by using the first signal and the second signal, the extraction module 61 uses a method of extracting the sound produced by the shaft or bearing of one of fans from the signals of sounds produced by the shafts or bearings of the fans, such as beam forming or noise cancelling. For example, in a method of beam forming, in consideration of a factor that the phase difference in the target sound received by two microphones is different from the phase difference in the noise received by the two microphones, only noise is suppressed from a signal including the target sound and noise. If beam forming is used, the microphones 23A and 23B may be provided at positions where they are less affected by the airflow produced by the fans 21A and 21B, and further, the phase difference in the target sound received by the two microphones 23A and 23B is different from that in noise.

The detection module 62 detects the abnormality of one of the first and second fans 21A and 21B, at least using the first sound and the second sound. For example, the detection module 62 detects the abnormality of the first fan 21A, at least using change in the first sound produced by the shaft 25A or the bearing 26A of the first fan 21A in a first period. For example, the detection module 62 detects the abnormality of the second fan 21B, at least using change in the second sound produced by the shaft 25B or the bearing 26B of the second fan 21B in a second period.

More specifically, for example, the detection module 62 obtains a power spectrum by applying the Fourier transform to the signal (data) of the first sound. The detection module 62 detects the abnormality of the first fan 21A based on the change in the power spectrum of the first sound in the first period. For example, the detection module 62 determines that an abnormality occurs in the first fan 21A when the amount of change in the power spectrum or the amount of change in a specific frequency band is greater than or equal to a threshold.

For example, the detection module 62 obtains a power spectrum by applying the Fourier transform to the signal (data) of the second sound. The detection module 62 detects the abnormality of the second fan 21B based on the change in the power spectrum of the second sound in the second period. For example, the detection module 62 determines that an abnormality occurs in the second fan 21B when the amount of change in the power spectrum or the amount of change in a specific frequency band is greater than or equal to a threshold.

The method of detecting the abnormality of each of the first fan 21A and the second fan 21B is not limited to the above method using a power spectrum. Various methods may be used to detect the abnormality of each device based on the operating noise.

If an abnormality is detected in the first fan 21A, the notification module 63 performs a process for indicating that the abnormality is detected in the first fan 21A. If an abnormality is detected in the second fan 21B, the notification module 63 performs a process for indicating that the abnormality is detected in the second fan 21B. For example, the notification module 63 generates a signal for notification using at least one of the display 54, the LED 55 and the speaker 56, and outputs the signal to the display 54, the LED 55 and/or the speaker 56.

The notification module 63 may transmit a message indicating the abnormality of each of the fans 21A and 21B via the communication device 53 to a computer (not shown) which is used by the administrator, etc., and is different from the server 31. In this case, the administrator can be notified of the abnormality of each of the fans 21A and 21B, using the display, LED, speaker, etc., of the different computer.

Figure 6:
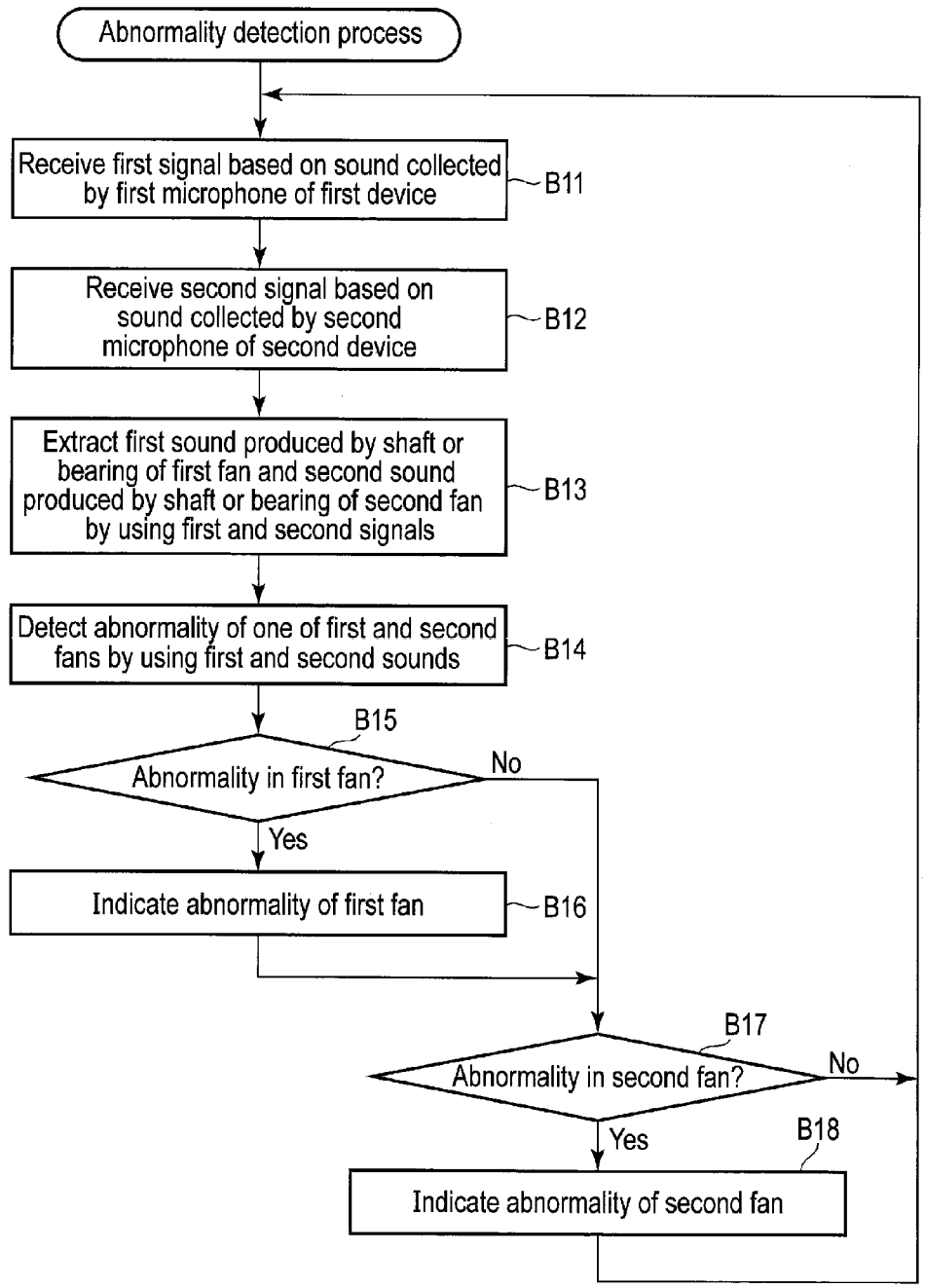
FIG. 6 is a flowchart showing an example of the procedure of an abnormality detection process performed by the electronic apparatus of the embodiment.

Now, this specification explains an example of the procedure of an abnormality detection process performed by the server 31 with reference to the flowchart of FIG. 6.

The server 31 receives the first signal based on the sound collected by the microphone 23A of the target device 11A (block B11). The server 31 also receives the second signal based on the sound collected by the microphone 23B of the target device 11B (block B12).

The server 31 extracts the first sound produced by the shaft 25A or the bearing 26A of the first fan 21A and the second sound produced by the shaft 25B or the bearing 26B of the second fan 21B, using the first signal and the second signal (block B13). The server 31 detects the abnormality of one of the first and second fans 21A and 21B, using the extracted first and second sounds (block B14). The server 31 may detect the abnormalities of both of the first and second fans 21A and 21B, using the extracted first and second sounds.

Subsequently, the server 31 determines whether an abnormality occurs in the first fan 21A based on the result of detection of block B14 (block B15). If an abnormality occurs in the first fan 21A (Yes in block B15), the server 31 notifies the administrator, etc., of the abnormality of the first fan 21A (block B16).

If no abnormality occurs in the first fan 21A (No in block B15), or after the administrator, etc., is notified of the abnormality of the first fan 21A in block B16, the server 31 determines whether an abnormality occurs in the second fan 21B (block B17). If an abnormality occurs in the second fan 21B (Yes in block B17), the server 31 notifies the administrator, etc., of the abnormality of the second fan 21B (block B18).

If no abnormality occurs in the second fan 21B (No in block B17), or after the administrator, etc., is notified of the abnormality of the second fan 21B in block B18, the process returns to block B11 and continues to detect abnormality.

By the above structure, the abnormality of each target device can be more accurately detected. The server 31 detects the abnormality of each of the first fan 21A provided in the housing 22A of the target device 11A and the second fan 21B provided in the housing 22B of the target device 11B. If the direction of airflow produced by the operation of the first fan 21A is the first direction, the first microphone 23A is provided at the first position the first distance away from the first fan 21A in a direction perpendicular to the first direction inside the first housing 22A on a side opposite to the first direction with respect to the first surface on which the first fan 21A is provided. If the direction of airflow produced by the operation of the second fan 21B is the second direction, the second microphone 23B is provided at the second position the second distance away from the second fan 21B in a direction perpendicular to the second direction inside the second housing 22B on a side opposite to the second direction with respect to the second surface on which the second fan 21B is provided.

Thus, the first microphone 23A and the second microphone 23B are provided such that they are less affected by the airflow produced by the first fan 21A and the second fan 21B. In this manner, the signal-to-noise ratio of signals collected by the microphones 23A and 23B is improved. It is possible to improve the accuracy of analysis of abnormality or failure of each of the target devices 11A and 11B using the signals.

The above configuration of the server 31 may be provided inside the target devices 11A and 11B. In this case, the target devices 11A and 11B are capable of internally detecting the abnormality of each of the fans 21A and 21B, respectively, and notifying the administrator of the abnormality.

Now, this specification explains another example of the system for monitoring a target device by the server 31 with reference to FIGS. 7 to 10. In the example of FIGS. 2 to 6, the server 31 monitors the two target devices 11A and 11B including the fans 21A and 21B, respectively. In the following example, the server 31 monitors a single target device 11C including two fans 21C and 21D.

FIG. 7 shows an example of the external appearance of the target device 11C. In this example, the target device 11C is a UPS including the fans 21C and 21D. In the target device 11C, the air in the housing is discharged to the outside of the housing through outlets 12C and 12D as opening portions, using the fans 21C and 21D. In this way, heat exhaust is performed.

More specifically, the target device 11C has a housing 22C such that the outlets 12C and 12D are adjacent to each other on the upper surface of the housing 22C. The fan 21C configured to discharge the air in the housing 22C to the outside of the housing 22C is provided in the outlet 12C. The fan 21D configured to discharge the air in the housing 22C to the outside of the housing 22C is provided in the outlet 12D.

As shown in the cross-sectional view of FIG. 8, the fan 21C is provided in the outlet 12C provided on the upper surface of the housing 22C. The fan 21C is connected to a motor 24C, a shaft 25C and a bearing 26C for rotation. The shaft 25C located in the center of the fan 21C is a component configured to transfer power by the motor 24C, rotate with the fan 21C and serve as the center of rotation. The bearing 26C is a component which is in contact with the rotating fan 21C (shaft 25C), receives load and supports the shaft 25C, etc.

FIG. 8 shows arrows 113 schematically indicating the direction of airflow produced by rotation of the fan 21C. A microphone 23C (first microphone) is provided near the fan 21C at a position off the airflow on a side opposite to the direction of airflow (in other words, the direction of discharge) 113 with respect to the housing 22C to which the fan 21C is secured. When it is difficult to provide the microphone 23C at a position completely off the direction of airflow 113, the microphone 23C may be provided at a position which reduces the influence of the airflow as much as possible.

As shown in FIG. 8, when the direction of airflow 113 produced by operation of the fan 21C is the first direction, for example, the microphone 23C is provided at the first position the first distance away from the fan 21C in a direction perpendicular to the first direction inside the housing 22C on a side opposite to the first direction with respect to the first surface on which the fan 21C is provided (for example, the upper surface of the housing 22C including the outlet 12C). Thus, the microphone 23C is provided at the first position the first distance away from the fan 21C in a direction perpendicular to the first direction inside the housing 22C on the windward side with respect to the first surface on which the fan 21C is provided. The microphone 23C may be provided at a position off the airflow produced by the fan 21C in a horizontal direction from the shaft 25C or the bearing 26C of the fan 21C. In the example of FIG. 8, the microphone 23C is provided on the rear surface of the top board of the housing 22C. However, the microphone 23C may be provided at an arbitrary position satisfying the above conditions, for example, at an arbitrary position inside an area 233. Alternatively, the microphone 23C may be provided at a position the first distance away from the fan 21C in a direction perpendicular to the first direction outside the housing 22C on the downwind side with respect to the first surface on which the fan 21C is provided.

The above structure reduces air noise produced by application of air of the operating fan 21C to the microphone 23C. In this way, it is possible to reduce disturbance to a signal obtained by the microphone 23C, in other words, inclusion of noise in the signal.

The outlet 12D is further provided on the upper surface of the housing 22C of the target device 11C. The fan 21D configured to discharge the air in the housing 22C to the outside of the housing 22C is provided in the outlet 12D.

As shown in the cross-sectional view of FIG. 8, the fan 21D is provided in the outlet 12D provided on the upper surface of the housing 22C. The fan 21D is connected to a motor 24D, a shaft 25D and a bearing 26D for rotation. The shaft 25D located in the center of the fan 21D is a component configured to transfer power by the motor 24D, rotate with the fan 21D and serve as the center of rotation. The bearing 26D is a component which is in contact with the rotating fan 21D (shaft 25D), receives load and supports the shaft 25D, etc.

FIG. 8 shows arrows 114 schematically indicating the direction of airflow produced by rotation of the fan 21D. A microphone 23D (second microphone) is provided near the fan 21D at a position off the airflow on a side opposite to the direction of airflow 114 with respect to the housing 22C to which the fan 21D is secured. When it is difficult to provide the microphone 23D at a position completely off the direction of airflow 114, the microphone 23D may be provided at a position which reduces the influence of the airflow as much as possible.

As shown in FIG. 8, if the direction of airflow 114 produced by operation of the fan 21D is the second direction, for example, the microphone 23D is provided at the second position the second distance away from the fan 21D in a direction perpendicular to the second direction inside the housing 22C on a side opposite to the second direction with respect to the second surface on which the fan 21D is provided (for example, the upper surface of the housing 22C including the outlet 12D). Thus, the microphone 23D is provided at the second position the second distance away from the fan 21D in a direction perpendicular to the second direction inside the housing 22C on the windward side with respect to the second surface on which the fan 21D is provided. The microphone 23D may be provided at a position off the airflow produced by the fan 21D in a horizontal direction from the shaft 25D or the bearing 26D of the fan 21D. In the example of FIG. 8, the microphone 23D is provided on the rear surface of the top board of the housing 22C. However, the microphone 23D may be provided at an arbitrary position satisfying the above conditions, for example, at an arbitrary position inside an area 234. Alternatively, the microphone 23D may be provided at a position the second distance away from the fan 21D in a direction perpendicular to the second direction outside the housing 22C on the downwind side with respect to the second surface on which the fan 21D is provided.

The above structure reduces air noise produced by application of air of the operating fan 21D to the microphone 23D. In this way, it is possible to reduce disturbance to a signal obtained by the microphone 23D, in other words, inclusion of noise in the signal.

The microphones 23C and 23D are provided so as to reduce the influence of the airflow. In this manner, the signal-to-noise ratio of signals collected by the microphones 23C and 23D is improved. It is possible to improve the accuracy of analysis of abnormality or failure using the signals. Moreover, the above arrangement can reduce the cost of the microphones 23C and 23D to be used (degrade the performance of the microphones 23C and 23D to be used).

Figure 9:
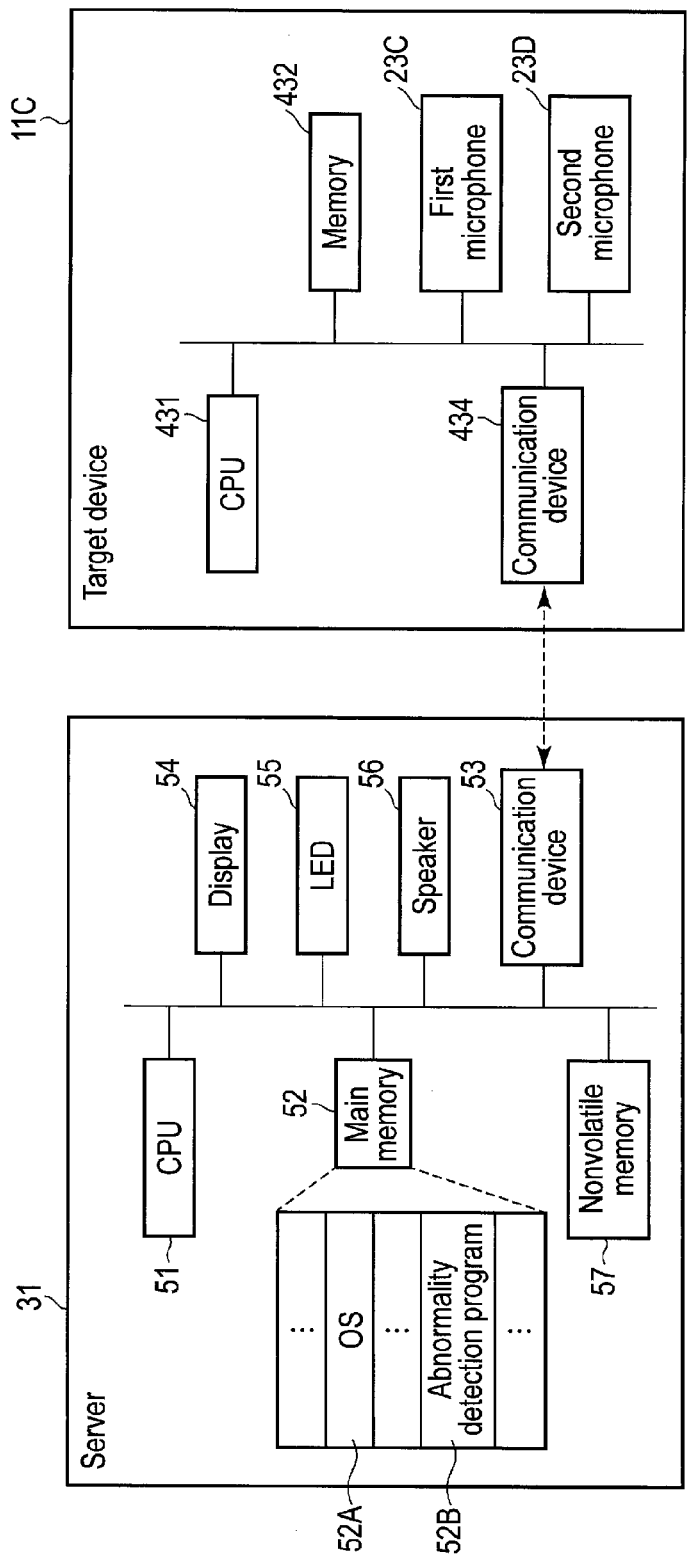
FIG. 9 is a block diagram showing another example of the system configuration of the target device and the electronic apparatus of the embodiment.

FIG. 9 shows the system configuration of the server 31 and the target device 11C. The server 31 detects the abnormality of each the fans 21C and 21D provided in the housing 22C of the target device 11C.

The target device 11C includes, for example, a CPU 431, a memory 432, the first microphone 23C, the second microphone 23D, and a communication device 434.

The CPU 431 is a processor configured to control the operations of various components in the target device 11C. The communication device 434 is a device configured to perform wired or wireless communication. The communication device 434 includes a transmitter configured to transmit a signal, and a receiver configured to receive a signal.

The CPU 431 obtains (generates) a signal of sound collected by the first microphone 23C, and obtains a signal of sound collected by the second microphone 23D. The CPU 431 transmits identifiers (ID) given to the microphones 23C and 23D in advance and the signals of sound obtained by the microphones 23C and 23D to the server 31, using the communication device 434. For example, the signals of sound are transmitted to the server 31 at regular time intervals. The obtained signals of sound may be stored in the memory 432, etc.

The server 31 includes, for example, a CPU 51, a main memory 52, a communication device 53, a display 54, an LED 55, a speaker 56, and a nonvolatile memory 57.

The CPU 51 is a processor configured to control the operations of various components in the server 31. The CPU 51 executes various programs loaded into the main memory 52 from the nonvolatile memory 57 which is a storage device. These programs include an operating system (OS) 52A and various application programs. The application programs include an abnormality detection program 52B. For example, the abnormality detection program 52B has a function for analyzing an audio signal received from the target device 11C, detecting the abnormality of the target device 11C and indicating the detected abnormality.

The communication device 53 is a device configured to perform wired or wireless communication. The communication device 53 includes a transmitter configured to transmit a signal, and a receiver configured to receive a signal. The receiver of the communication device 53 receives, for example, the first signal of sound collected by the first microphone 23C of the target device 11C, and the second signal of sound collected by the second microphone 23D of the target device 11C.

The display 54 displays a screen image based on a display signal generated by the CPU 51. The LED 55 is turned on based on a signal generated by the CPU 51. The speaker 56 outputs sound based on an audio signal generated by the CPU 51. The server 31 is capable of indicating the abnormality of the target device 11C, using at least one of the display 54, the LED 55 and the speaker 56. The indication of the abnormality of the target device 11C is not limited to the indication by the display 54, the LED 55 and/or the speaker 56. Any structure may be employed as long as the administrator can recognize the abnormality of the target device 11C (for example, the abnormality of each of the fans 21C and 21D).

The abnormality detection program 52B executed by the server 31 includes a structure similar to that of FIG. 5. The first signal of sound collected by the first microphone 23C of the target device 11C and the second signal of sound collected by the second microphone 23D are received via the communication device 53. The received first and second signals are input to the abnormality detection program 52B. As described above, the abnormality detection program 52B includes, for example, the extraction module 61, the detection module 62 and the notification module 63.

The extraction module 61 extracts the first sound produced by the shaft 25C or the bearing 26C of the fan 21C (first fan) of the target device 11C and the second sound produced by the shaft 25D or the bearing 26D of the fan 21D (second fan), using the first signal and the second signal.

The detection module 62 detects the abnormality of one of the first and second fans 21C and 21D, at least using the first sound and the second sound. The detection module 62 detects the abnormality of the first fan 21C, at least using change in the first sound produced by the shaft 25C or the bearing 26C of the first fan 21C in the first period. The detection module 62 detects the abnormality of the second fan 21D, at least using change in the second sound produced by the shaft 25D or the bearing 26D of the second fan 21D in the second period.

More specifically, for example, the detection module 62 obtains a power spectrum by applying the Fourier transform to the signal (data) of the first sound. The detection module 62 detects the abnormality of the first fan 21C based on the change in the power spectrum of the first sound in the first period. For example, the detection module 62 determines that an abnormality occurs in the first fan 21C when the amount of change in the power spectrum or the amount of change in a specific frequency band is greater than or equal to a threshold.

For example, the detection module 62 obtains a power spectrum by applying the Fourier transform to the signal (data) of the second sound. The detection module 62 detects the abnormality of the second fan 21D based on the change in the power spectrum of the second sound in the second period. For example, the detection module 62 determines that an abnormality occurs in the second fan 21D when the amount of change in the power spectrum or the amount of change in a specific frequency band is greater than or equal to a threshold.

If an abnormality is detected in the first fan 21C, the notification module 63 performs a process for indicating that the abnormality is detected in the first fan 21C. If an abnormality is detected in the second fan 21D, the notification module 63 performs a process for indicating that the abnormality is detected in the second fan 21D. For example, the notification module 63 generates a signal for notification using at least one of the display 54, the LED 55 and the speaker 56, and outputs the signal to the display 54, the LED 55 and/or the speaker 56.

The notification module 63 may transmit a message indicating the abnormality of the fans 21C and 21D via the communication device 53 to a computer (not shown) which is used by the administer, etc., and is different from the server 31. In this case, the administrator can be notified of the abnormality of each of the fans 21C and 21D, using the display, LED, speaker, etc., of the different computer.

Figure 10:
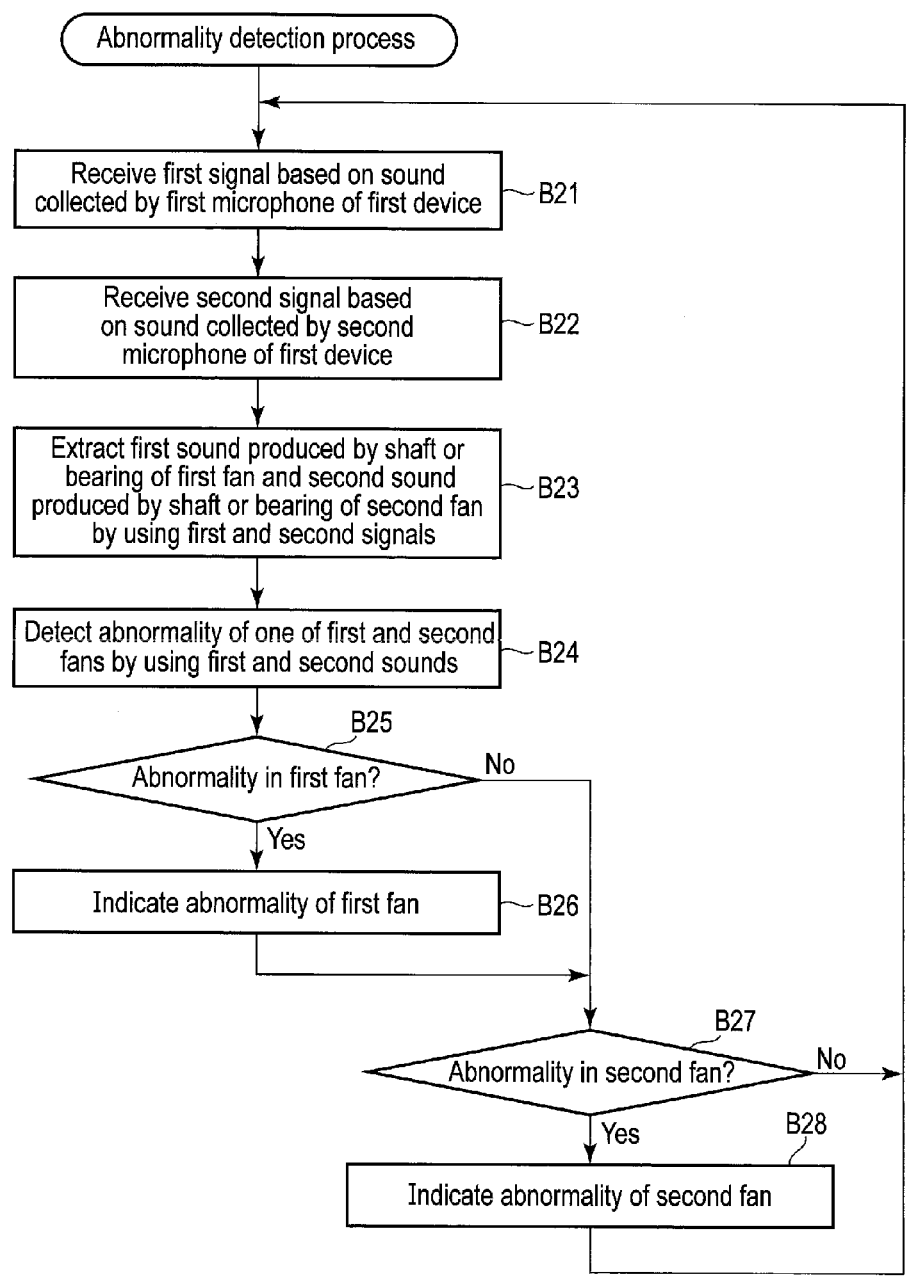
FIG. 10 is a flowchart showing another example of the procedure of an abnormality detection process performed by the electronic apparatus of the embodiment.

Now, this specification explains an example of the procedure of an abnormality detection process performed by the server 31 with reference to the flowchart of FIG. 10.

The server 31 receives the first signal based on the sound collected by the microphone 23C of the target device 11C (block B21). The server 31 also receives the second signal based on the sound collected by the microphone 23D of the target device 11C (block B22).

The server 31 extracts the first sound produced by the shaft 25C or the bearing 26C of the first fan 21C and the second sound produced by the shaft 25D or the bearing 26D of the second fan 21D, using the first signal and the second signal (block B23). The server 31 detects the abnormality of one of the first and second fans 21C and 21D, using the extracted first and second sounds (block B24). The server 31 may detect the abnormalities of both of the first and second fans 21C and 21D, using the extracted first and second sounds.

Subsequently, the server 31 determines whether an abnormality occurs in the first fan 21C based on the result of detection of block B24 (block B25). If an abnormality occurs in the first fan 21C (Yes in block B25), the server 31 notifies the administrator, etc., of the abnormality of the first fan 21C (block B26).

If no abnormality occurs in the first fan 21C (No in block B25), or after the administrator, etc., is notified of the abnormality of the first fan 21C in block B26, the server 31 determines whether an abnormality occurs in the second fan 21D (block B27). If an abnormality occurs in the second fan 21D (Yes in block B27), the server 31 notifies the administrator, etc., of the abnormality of the second fan 21D (block B28).

If no abnormality occurs in the second fan 21D (No in block B27), or after the administrator, etc., is notified of the abnormality of the second fan 21D in block B28, the process returns to block B21 and continues to detect abnormality.

By the above structure, the abnormality of the target device can be more accurately detected. The server 31 detects the abnormality of each of the first and second fans 21C and 21D provided in the housing 22C of the target device 11C. If the direction of airflow produced by the operation of the first fan 21C is the first direction, the first microphone 23C is provided at the first position the first distance away from the first fan 21C in a direction perpendicular to the first direction inside the first housing 22C on a side opposite to the first direction with respect to the first surface on which the first fan 21C is provided. If the direction of airflow produced by the operation of the second fan 21D is the second direction, the second microphone 23D is provided at the second position the second distance away from the second fan 21D in a direction perpendicular to the second direction inside the first housing 22C on a side opposite to the second direction with respect to the second surface on which the second fan 21D is provided.

Thus, the first microphone 23C and the second microphone 23D are provided such that they are less affected by the airflow produced by the first fan 21C and the second fan 21D. In this manner, the signal-to-noise ratio of signals collected by the microphones 23C and 23D is improved. It is possible to improve the accuracy of analysis of abnormality or failure of the target device 11C using the signals.

More outlets and fans may be provided in the target device 11C. The server 31 is capable of detecting the abnormality of each of three or more fans inside the target device 11C in parallel.

FIG. 11 shows yet another example of the external appearance of the target devices. As shown in FIG. 11, target devices 11E and 11F include, for example, housings 22E and 22F having the same shape, and are arranged such that the right side of the housing 22E of the target device 11E is in contact with the left side of the housing 22F of the target device 11F. In the target devices 11E and 11F, the air in the housings is discharged to the outside of the housing, using fans 21E, 21F, 21G and 21H. In this way, heat exhaust is performed. Each of the target devices 11E and 11F has a structure similar to that of the target device 11C described above.

The server 31 is capable of monitoring the target devices 11E and 11F in parallel in a manner similar to that of the target device 11C. For example, the server 31 detects the abnormality of each of the fans 21E and 21F provided in the housing 22E of the target device 11E and the abnormality of each of the fans 21G and 21H provided in the housing 22F of the target device 11F.

The server 31 may be further configured to monitor various target devices 11A to 11F in parallel. The server 31 is capable of detecting the abnormality of each of one or more fans of the target devices 11A to 11F in parallel.

As explained above, in the present embodiment, the abnormality of each target device can be more accurately detected. In the present embodiment, each microphone is provided so as to reduce air noise produced by the application of air of an operating fan to the microphone. In this way, it is possible to reduce disturbance to a signal obtained by each microphone, in other words, inclusion of noise in the signal. The accuracy of analysis of abnormality or failure using the signal can be improved.

Various functions described in the present embodiment may be implemented by a circuit (processing circuit). Examples of the processing circuit include a programmed processor such as a central processing unit (CPU). The processor realizes each of the described functions by executing a computer program (instructions) stored in a memory. The processor may be a microprocessor including an electronic circuit. Examples of the processing circuit also include a digital signal processor (DSP), an application-specific integrated circuit (ASIC), a microcontroller, a controller, and other electronic circuit components. Each of the components described in the present embodiment other than CPUs may be realized by a processing circuit.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus for detecting an abnormality of at least one of a first fan for a first device in a first housing and a second fan for a second device in a second housing, the electronic apparatus comprising:
   a receiver configured to receive a first signal of a first sound collected by a first microphone and a second signal of a second sound collected by a second microphone,
   wherein the first sound comprises a sound produced by a shaft or a bearing of the first fan,
   the second sound comprises a sound produced by a shaft or a bearing of the second fan, the first microphone is away a first distance from the first fan in a direction perpendicular to a first direction of an airflow produced by the first fan and provided on a side of the first housing corresponding to an opposite direction of the first direction, and the second microphone is away a second distance from the second fan in a direction perpendicular to a second direction of an airflow produced by the second fan and provided on a side of the second housing corresponding to an opposite direction of the second direction; and circuitry configured to:

detect an abnormality of one of the first and second fans by at least using the first sound and the second sound included in the first and second signals;

indicate that the abnormality is detected in the first fan, if an abnormality is detected in the first fan; and indicate that the abnormality is detected in the second fan, if an abnormality is detected in the second fan.

2. The electronic apparatus of claim 1, wherein the circuitry is configured to:

detect an abnormality of the first fan by at least using change in sounds produced by the shaft or the bearing of the first fan in a first period; and detect an abnormality of the second fan by at least using change in sounds produced by the shaft or the bearing of the second fan in a second period.

3. The electronic apparatus of claim 1, wherein the circuitry is further configured to extract the sound produced by the shaft or the bearing of the first fan and the sound produced by the shaft or the bearing of the second fan by using the first signal and the second signal.

4. The electronic apparatus of claim 1, wherein the first microphone is located in a horizontal direction from the shaft or the bearing of the first fan, and the second microphone is located in a horizontal direction from the shaft or the bearing of the second fan.

5. An electronic apparatus for detecting an abnormality of at least one of first and second fans for a first device in a first housing, the electronic apparatus comprising:

a receiver configured to receive a first signal of a first sound collected by a first microphone and a second signal of a second sound collected by a second microphone, wherein the first sound comprises a sound produced by a shaft or a bearing of the first fan, the second sound comprises a sound produced by a shaft or a bearing of the second fan, the first microphone is away a first distance from the first fan in a direction perpendicular to a first direction of an airflow produced by the first fan and provided on a side of the first housing corresponding to an opposite direction of the first direction, and the second microphone is away a second distance from the second fan in a direction perpendicular to a second direction of an airflow produced by the second fan and provided on a side of the first housing corresponding to an opposite direction of the second direction; and circuitry configured to:

detect an abnormality of one of the first and second fans by at least using the first sound and the second sound included in the first and second signals;

indicate that the abnormality is detected in the first fan, if an abnormality is detected in the first fan; and indicate that the abnormality is detected in the second fan, if an abnormality is detected in the second fan.

6. The electronic apparatus of claim 5, wherein the circuitry is configured to:

detect an abnormality of the first fan by at least using change in sounds produced by the shaft or the bearing of the first fan in a first period; and detect an abnormality of the second fan by at least using change in sounds produced by the shaft or the bearing of the second fan in a second period.

7. The electronic apparatus of claim 5, wherein the circuitry is configured to extract the sound produced by the shaft or the bearing of the first fan and the sound produced by the shaft or the bearing of the second fan by using the first signal and the second signal.

8. The electronic apparatus of claim 5, wherein the first microphone is located in a horizontal direction from the shaft or the bearing of the first fan, and the second microphone is located in a horizontal direction from the shaft or the bearing of the second fan.

9. A method of detecting an abnormality of at least one of a first fan and a second fan, the method comprising:

receiving a first signal of a first sound collected by a first microphone and a second signal of a second sound collected by a second microphone, wherein the first sound comprises a sound produced by a shaft or a bearing of the first fan, the second sound comprises a sound produced by a shaft or a bearing of the second fan, the first microphone is away a first distance from the first fan in a direction perpendicular to a first direction of an airflow produced by the first fan and provided on a side corresponding to an opposite direction of the first direction, and the second microphone is away a second distance from the second fan in a direction perpendicular to a second direction of an airflow produced by the second fan and provided on a side corresponding to an opposite direction of the second direction;

detecting an abnormality of one of the first and second fans by at least using the first sound and the second sound included in the first and second signals;

indicating that the abnormality is detected in the first fan, if an abnormality is detected in the first fan; and indicating that the abnormality is detected in the second fan, if an abnormality is detected in the second fan.

10. The method of claim 9, wherein the detecting comprises:

detecting an abnormality of the first fan by at least using change in sounds produced by the shaft or the bearing of the first fan in a first period; and detecting an abnormality of the second fan by at least using change in sounds produced by the shaft or the bearing of the second fan in a second period.

11. The method of claim 9, further comprising extracting the sound produced by the shaft or the bearing of the first fan and the sound produced by the shaft or the bearing of the second fan by using the first signal and the second signal.

12. The method of claim 9, wherein the first microphone is located in a horizontal direction from the shaft or the bearing of the first fan, and the second microphone is located in a horizontal direction from the shaft or the bearing of the second fan.

* * * * *